United States Patent [19]
Sekiya et al.

[11] 4,433,920
[45] Feb. 28, 1984

[54] ELECTRONIC TIMEPIECE HAVING IMPROVED PRIMARY FREQUENCY DIVIDER RESPONSE CHARACTERISTICS

[75] Inventors: Fukuo Sekiya; Shigeru Morokawa; Ryoji Iwakura, all of Tokorozawa, Japan

[73] Assignee: Citizen Watch Company Limited, Tokyo, Japan

[21] Appl. No.: 281,251

[22] Filed: Jul. 7, 1981

[30] Foreign Application Priority Data

| Jul. 8, 1980 [JP] | Japan | 55-92861 |
| Jul. 15, 1980 [JP] | Japan | 55-96429 |
| Jul. 18, 1980 [JP] | Japan | 55-98325 |
| Jul. 21, 1980 [JP] | Japan | 55-99567 |

[51] Int. Cl.³ .................................................. G04B 17/12
[52] U.S. Cl. .................................. 368/201; 368/204; 368/181
[58] Field of Search ............... 368/202, 219, 204, 156, 368/201

[56] References Cited

U.S. PATENT DOCUMENTS

| 4,094,137 | 6/1978 | Morokawa | 368/202 |
| 4,095,407 | 6/1978 | Asano et al. | 368/219 |
| 4,119,867 | 10/1978 | Morokawa et al. | 368/219 |
| 4,326,277 | 4/1982 | Nishikubo | 368/204 |
| 4,328,572 | 5/1982 | Kawahara | 368/156 |
| 4,333,171 | 6/1982 | Nishikubo | 368/219 |
| 4,374,332 | 2/1983 | Inami et al. | 368/219 |

*Primary Examiner*—Bernard Roskoski
*Attorney, Agent, or Firm*—Jordan and Hamburg

[57] ABSTRACT

In an electronic timepiece having a primary frequency divider circuit coupled to receive a standard frequency signal and comprising a group of P-channel FETs and a group of N-channel FETs, a bias circuit supplies a bias input to the P-channel FET group and a separate bias input to the N-channel FET group. By providing these bias inputs through current mirror coupling from a standard current source, the response of the primary frequency divider circuit to low amplitudes of the standard frequency signal can be made substantially independent of timepiece battery voltage variations, over a wide range of battery voltages.

5 Claims, 17 Drawing Figures

ELECTRONIC TIMEPIECE HAVING IMPROVED PRIMARY FREQUENCY DIVIDER RESPONSE CHARACTERISTICS

BACKGROUND OF THE INVENTION

The present invention relates to means for improving the range of response to low-amplitude input signals of a dynamic frequency divider circuit used as a primary frequency divider circuit in an electronic timepiece, being coupled to directly receive a standard frequency signal which is generated by a standard frequency signal source such as a quartz crystal oscillator circuit of the electronic timepiece. The present invention enables the range of response to be optimized with respect to a particular supply voltage applied to power the dynamic frequency divider circuit and the standard frequency signal source, so that these can be operated at a supply voltage which is substantially lower than the timepiece battery voltage with a very low amplitude signal being output from the standard frequency signal source, and in addition can enable the response characteristics of the dynamic frequency divider circuit to be made substantially independent of variations in the timepiece battery voltage, to thereby enable dependable operation of the dynamic frequency divider circuit with a very low amplitude of standard frequency signal.

At the present time, the great majority of electronic timepieces being manufactured utilize a quartz crystal oscillator circuit as a standard frequency signal source for producing an output signal which is frequency divided to provide a unit time signal, having a frequency of, for example, 1 Hz. This unit time signal is applied to drive a stepping motor, in the case of an analog display type of timepiece, or is input to timekeeping counter circuits which drive a digital display through driver/decoder circuits, in the case of a digital timepiece. In recent years, there has been an increasing requirement for a reduction of the power consumption of such electronic timepieces. Since CMOS field-effect transistor integrated circuits are almost universally used, the main cause of circuit power consumption lies in the standard frequency signal source, i.e. the quartz crystal oscillator circuit, and in the primary stages of frequency division which are coupled to the output signal from the quartz crystal oscillator circuit, since these circuits all operate at a high switching speed. In order to reduce the power consumption of these circuits, therefore, measures are taken such as reducing the value of supply voltage applied thereto to a lower level than the battery output voltage, and reducing the amplification factor of the amplifier used in the quartz crystal oscillator circuit. However, these measures also result in a reduction in the amplitude of output signal produced by the quartz crystal oscillator circuit, and in some cases the peak-to-peak amplitude of this signal may become as low as ½ of the battery voltage of the timepiece. Such a low amplitude of input signal applied to the primary frequency divider circuit stages may result in incorrect operation of these stages. This is particularly true in the case of a dynamic frequency divider circuit being used as a primary frequency divider circuit. A dynamic frequency divider circuit is often used as a primary frequency divider circuit when the frequency of oscillation of the timepiece quartz crystal oscillator circuit is made very high, e.g. of the order of several MHz, in order to obtain the advantages of superior timekeeping accuracy obtainable by using a high frequency quartz crystal vibrator as a frequency standard. Thus, in the prior art, it has been difficult to obtain the advantages of utilizing a high frequency quartz crystal oscillator circuit as a standard frequency signal source together with the advantages of low power consumption which can be obtained by operating the quartz crystal oscillator circuit and primary frequency divider circuit stages at a low value of supply voltage, with a very low signal level being input to the primary frequency divider circuit stages from the quartz crystal oscillator circuit.

With the present invention, as will be described hereinafter, the above disadvantages encountered in the prior art are substantially reduced, thereby making practicable an electronic timepiece having a high frequency quartz crystal oscillator circuit as a standard frequency signal source but in which the level of power consumption in the quartz crystal oscillator circuit and in the primary frequency divider circuit stages is held to a very low level, and in which reliable timekeeping operation is assured in spite of variations in the timepiece battery voltage.

SUMMARY OF THE INVENTION

The present invention comprises an electronic timepiece powered by a battery and having a standard frequency signal source, a primary frequency divider circuit for performing frequency division of a relatively high frequency output signal from the standard frequency signal source, with this primary frequency divider circuit comprising a group of P-channel field-effect transistors and a group of N-channel field-effect transistors which cooperate in the frequency division process and each have a gate electrode coupled to receive the output signal from the standard frequency signal source, and a bias circuit for producing bias voltages which are applied to these gate electrodes of the P-channel field-effect transistor group and N-channel field-effect transistor group in such a way as to enable reliable operation of the primary frequency divider circuit even when the amplitude of output signal produced by the standard frequency signal source is very low. Such a bias circuit according to the present invention can also be arranged such as to ensure reliable operation of the primary frequency divider circuit and also of the standard frequency signal source, when the latter consists of a quartz crystal oscillator circuit, irrespective of substantial variations in the output voltage of the timepiece battery. An electronic timepiece according to the present invention further comprises secondary frequency divider circuit means coupled to receive a frequency-divided output signal from the primary frequency divider circuit, and drive and display means coupled to the secondary frequency divider circuit such as to provide a display of time information.

The present invention is especially applicable to an electronic timepiece incorporating a standard frequency signal source comprising a quartz crystal oscillator circuit operating at a relatively high frequency of oscillation, e.g. several hundred KHz or several MHz, and in which a dynamic frequency divider circuit is used as the primary frequency divider circuit. The present invention enables reliable operation of such a quartz crystal oscillator circuit and dynamic frequency divider circuit with a low level of power consumption, and can eliminate incorrect operation resulting from variations in battery voltage. This is achieved by ensuring that the primary frequency divider circuit performs accurate frequency division of the output signal from the standard frequency signal source even for low amplitudes of that output signal, over a wide range of battery voltages, through the action of bias voltages applied separately to the P-channel field-effect transistor group and N-channel field-effect transistor group of the primary frequency divider circuit.

DESCRIPTION OF THE PREFERRED EMBODIMENTS

Figure 1:
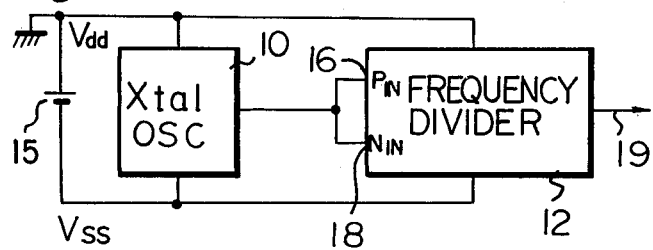
FIG. 1 is a simplified block circuit diagram illustrating a connection arrangement of a quartz crystal oscillator circuit and a primary frequency divider circuit for an electronic timepiece according to the prior art.

Referring now to the attached drawings, FIG. 1 is a simplified block circuit diagram illustrating a typical connection arrangement generally adopted in the prior art for a quartz crystal oscillator circuit used as a standard frequency signal source and a primary frequency divider circuit which comprises a group of P-channel field-effect transistors and a group of N-channel field-effect transistors, with an output signal from the primary frequency divider circuit being used to provide time information to be displayed by an electronic timepiece. Numeral 10 denotes a quartz crystal oscillator circuit, which produces a standard frequency signal that is applied to a frequency divider circuit 12. Both quartz crystal oscillator circuit 10 and frequency divider circuit 12 receive a supply voltage directly from a battery 14, producing a high potential Vdd and a low potential Vss. Since the Vdd potential of a timepiece battery is generally connected to ground potential, the battery voltage will be referred to herein simply as Vss, for brevity of description. Gate electrodes of the P-channel field-effect transistor group of frequency divider circuit 12 are coupled to an input terminal 16, while gate electrodes of the N-channel field-effect transistor group are coupled to an input terminal 18, to thereby receive the input signal from quartz crystal oscillator circuit 10. An output signal on line 19 is sent from frequency divider circuit 12 to subsequent stages of the timepiece circuits.

Figure 2:
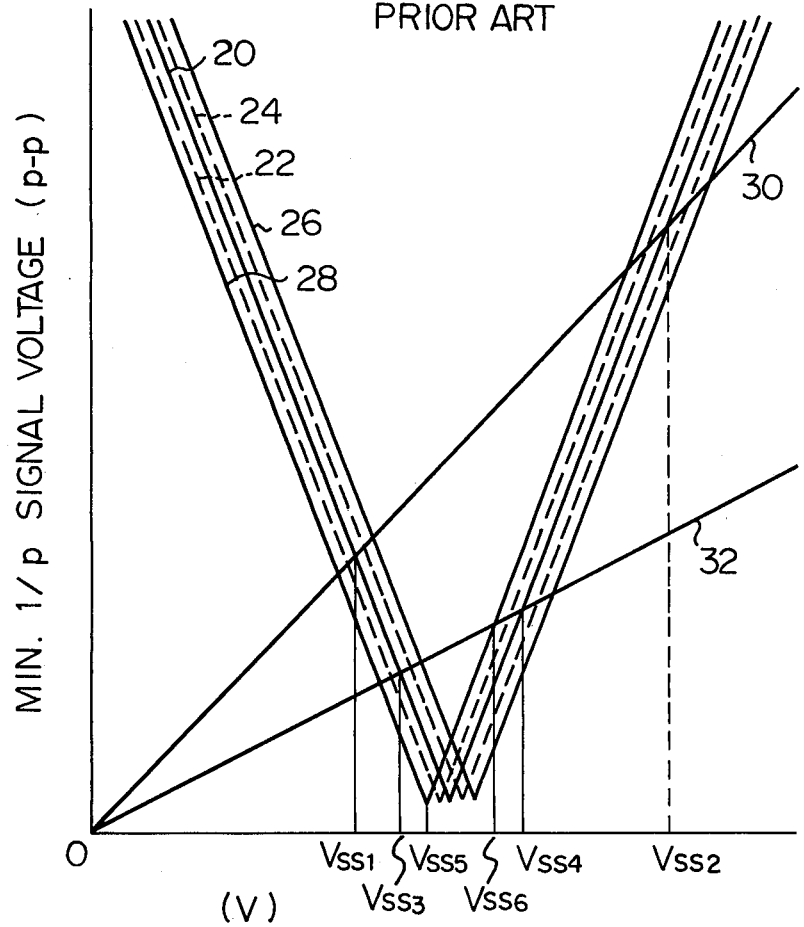
FIG. 2 is a diagram illustrating the relationships between battery voltage and the minimum level of input signal voltage for which correct frequency division operation is obtained, for a dynamic frequency divider circuit used in an electronic timepiece in the prior art.

FIG. 2 illustrates the relationship between the minimum input signal amplitude (peak-to-peak) applied to frequency divider circuit 12 and the supply voltage Vss applied to the frequency divider circuit, for the case in which this circuit is a dynamic frequency divider circuit. Characteristics for the latter signal amplitude/supply voltage relationship are denoted by numerals 20 to 28. Numeral 30 is a line representing the characteristic for which the input signal amplitude (peak-to-peak) is equal to the supply voltage Vss. Line 32 is the characteristic for which the input signal amplitude is ½ of the supply voltage Vss. Numeral 20 denotes a typical response characteristic, i.e. the characteristic of the minimum values of input signal amplitude for which correct operation of the dynamic frequency divider circuit occurs (plotted along the vertical axis) relative to the supply voltage (plotted along the horizontal axis. For each point along characteristic 20, a reduction in the input signal amplitude will result in operation of the dynamic frequency divider circuit becoming unreliable. The shape and position of this characteristics depends upon the method of manufacture of the field-effect transistors of the integrated circuit containing the dynamic frequency divider circuit, and in particular upon the threshold voltage (referred to herein as Vth) of these transistors. If the characteristic 20 is assumed to be that of a dynamic frequency divider circuit having transistors of normal threshold voltage, then in the case of the threshold voltage of these transistors being lower than normal, the characteristic will be shifted to the left, for example to the position denoted by numeral 22. On the other hand, if the threshold voltage of the transistors of the dynamic frequency divider circuit is higher than normal, then the characteristic will be shifted to the right, for example to the position indicated by numeral 24. The response characteristic is also affected by the operating temperature. If a dynamic frequency divider circuit having transistors of lower than normal threshold voltage is used at a high temperature, then the response characteristic may be shifted to the position denoted by numeral 28. Similarly, if the transistors have a high value of threshold voltage, then the characteristic may become as denoted by 26, when the operating temperature is low.

If it is assumed that the peak-to-peak input signal amplitude applied to the dynamic frequency divider circuit is equal to the battery voltage Vss, then satisfactory frequency division operation will be obtained over the range of battery voltages from Vss1 to Vss2, for the case of a dynamic frequency divider circuit having transistors of normal threshold voltage operating at normal temperature, i.e. characteristic 20. In the prior art, the battery voltage Vss is applied directly to supply the quartz crystal oscillator circuit of an electronic timepiece, and in addition, to ensure reliable operation of the quartz crystal oscillator circuit at low levels of battery voltage, the amplification factor of the amplifier used in the oscillator circuit is made higher than is actually required under normal operating conditions. Thus, the output signal voltage amplitude from such a quartz crystal oscillator circuit is generally approximately equal to the battery voltage, e.g. of the order of 1.5 V p-p when the battery voltage is normal. In this case, the range of battery voltages over which correct operation of the dynamic frequency divider circuit is assured is relatively large, i.e. from Vss1 from Vss2 as shown in FIG. 2 under normal conditions. It can be seen from FIG. 2 that with this relationship, i.e. oscillator circuit output signal amplitude approximately equal to the battery voltage, an ample range of battery voltages over which the dynamic frequency divider circuit operates correctly is assured, even in the worst case combination of threshold voltage variation due to manufacturing spreads and operating temperature variations.

However, in order to minimize the power consumption of quartz crystal oscillator circuit 10, it is desirable to reduce the supply voltage applied to this circuit, and also to make the amplification factor of the amplifier used in this oscillator circuit as low as possible. Such measures result in the amplitude of the output signal from quartz crystal oscillator circuit 10 being reduced, and in some cases this output signal amplitude (peak-to-peak) may become as low as ½ of the battery voltage Vss. In this case, as can be seen from FIG. 2 the range of battery voltages over which satisfactory performance of the dynamic frequency divider circuit is obtained will be from Vss3 to Vss4 when the transistor threshold voltage of the frequency divider circuit is normal, and the operating temperature is normal. Under the worst case operating condition, the acceptable battery voltage range will fall from Vss5 to Vss6, taking into account temperature and processing variations. Thus, the range of battery voltages over which reliable frequency divider circuit operation is assured will become very narrow, so that satisfactory operation is difficult to guarantee. This is important, since the output voltage of an electronic timepiece battery can vary considerably, due to changes in temperature, load, battery age, etc.

Figure 3:
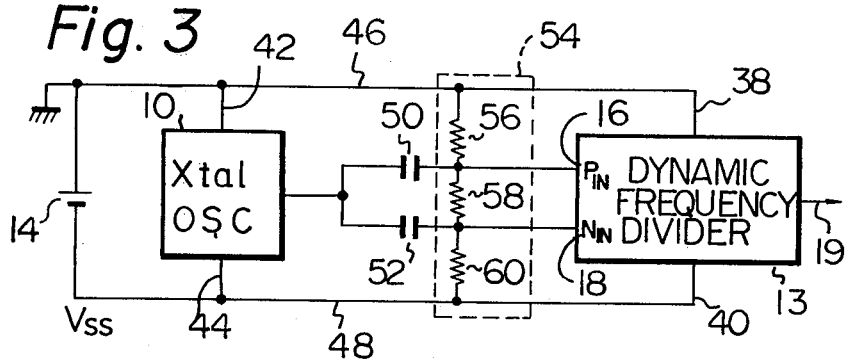
FIG. 3 is a simplified block circuit diagram of a first embodiment of a combination of a quartz crystal oscillator circuit, bias circuit, and dynamic frequency circuit for an electronic timepiece according to the present invention.

Referring now to FIG. 3, a first embodiment of a bias circuit for a dynamic frequency divider circuit used in an electronic timepiece according to the present invention is shown. In FIG. 3, a DC power source 14 (which may comprise a battery or a circuit for supplying power at a lower voltage than the battery voltage) supplies power to a quartz crystal oscillator circuit 10, a bias circuit 54 and a dynamic frequency divider circuit 13. Numeral 38 and 40 denote power supply leads of dynamic frequency divider circuit 13, while numerals 42 and 44 denote the high and low potential supply voltage leads, respectively, of quartz crystal oscillator circuit 10. Leads 38 and 42 are connected in common to a lead 46, connected to the high potential side of power source 15. Supply voltage leads 40 and 44 are connected in common to a lead 48, connected to the low potential side of DC power source 15. Bias circuit 54 is connected between leads 46 and 48.

The output signal from quartz crystal oscillator circuit 10 is applied through a capacitor 50 to an input terminal 16 of dynamic frequency divider circuit 13, which is coupled to gate electrodes of a group of P-channel field-effect transistors. The output signal from quartz crystal oscillator circuit 10 is also applied through a capacitor 52 to an input terminal 18 of dynamic frequency divider circuit 13, which is coupled to gate electrodes of a group of N-channel field effect transistors in dynamic frequency divider circuit 13. Bias circuit 54 comprises three resistors 56, 58 and 60, each having a very high value of resistance, connected in series between the common power supply leads 46 and 48. The junction of resistors 56 and 58 is connected to input terminal 16 of dynamic frequency divider circuit 13 to thereby apply a bias voltage to gate electrodes of the P-channel field-effect transistor group in dynamic frequency divider circuit 13, while the junction of resistors 58 and 60 is connected to input terminal 18 of dynamic frequency divider circuit 13, to thereby apply a bias voltage to gate electrodes of the N-channel field-effect transistor group in dynamic frequency divider circuit 13, having a different value from the bias voltage applied to input terminal 16.

The frequency-divided output signal from dynamic frequency divider circuit 13 is transferred over line 19 to subsequent stages of the electronic timepiece.

Figure 4:
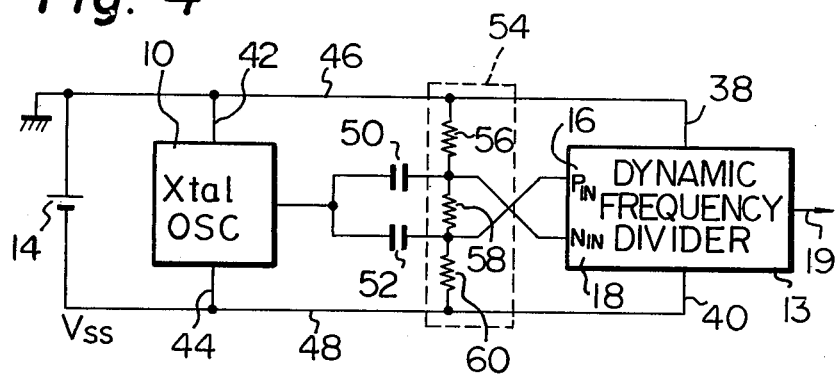
FIG. 4 is a simplified block diagram of a second embodiment of a combination of a quartz crystal oscillator circuit, bias circuit, and dynamic frequency divider circuit according to the present invention.

Another embodiment of a bias circuit coupled to a dynamic frequency divider circuit is shown in FIG. 4. This is similar to the embodiment of FIG. 3, with the difference that the junction of resistors 56 and 58 is connected to the N-channel field-effect transistor group input terminal 18 of dynamic frequency divider circuit 13, while the junction of resistors 58 and 60 is connected to the P-channel field-effect transistor group input terminal 16 of dynamic frequency divider circuit 13.

Figure 5:
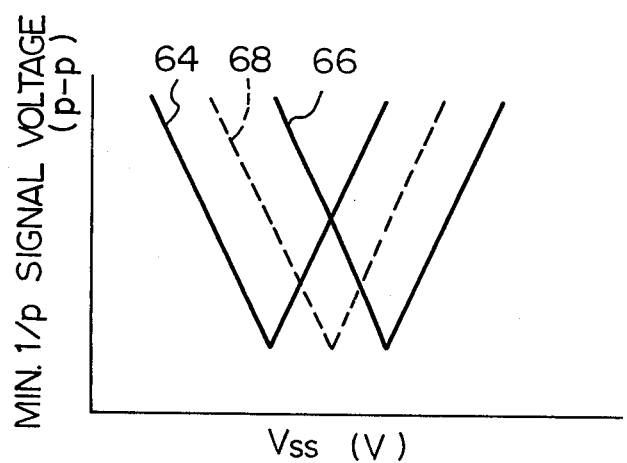
FIG. 5 is a graph illustrating how the response characteristics of a dynamic frequency divider circuit with respect to minimum input signal voltage level and supply voltage can be adjusted by the bias circuits of the embodiments of FIG. 3 and FIG. 4.

FIG. 5 illustrates the relationship between minimum input signal voltage level and supply voltage Vss for the embodiments of FIG. 3 and FIG. 4. Numeral 68 denotes the characteristic assuming that a bias voltage equal to ½ Vss is applied in common to input terminals 16 and 18 of dynamic frequency divider circuit 13. The characteristic 66 is obtained from the embodiment of FIG. 3. This is identical in shape to characteristic 68, but is shifted to the right. For the embodiment of FIG. 4, characteristic 64 would be obtained, i.e. the characteristic 68 is shifted to the left. It can thus be seen that by using the embodiments of bias circuits for a dynamic frequency divider circuit according to the present invention illustrated in FIG. 3 or FIG. 4, the minimum input signal level response characteristic can be shifted with respect to the supply voltage applied to the dynamic frequency divider circuit. Thus, if the supply voltage applied over lines 46 and 48 to quartz crystal oscillator circuit 10 and dynamic frequency divider circuit 13 is made lower than the battery voltage of the timepiece, so that the amplitude of output signal from quartz crystal oscillator circuit 10 is low, and hence the range of supply voltages for dynamic frequency divider circuit 13 within which correct operation is assured becomes narrow (as described with reference to FIG. 2), then the position of the latter narrow range can be adjusted to an optimum position in relation to the supply voltage applied to dynamic frequency divider circuit 13 by suitably setting the bias voltages applied thereto, by using the biasing arrangement shown in FIG. 3 or FIG. 4. It can thereby be arranged that satisfactory operation of the dynamic frequency divider circuit 13 is assured, even if there is some variation in the timepiece battery voltage, in spite of a low level of output signal voltage from quartz crystal oscillator circuit 10 due to measures taken to reduce the power consumption in the oscillator and primary frequency divider circuit stages of the timepiece. Use of a relatively high frequency, and hence high accuracy, quartz crystal oscillator circuit is thereby made significantly more practicable than has been possible in the prior art.

Figure 6:
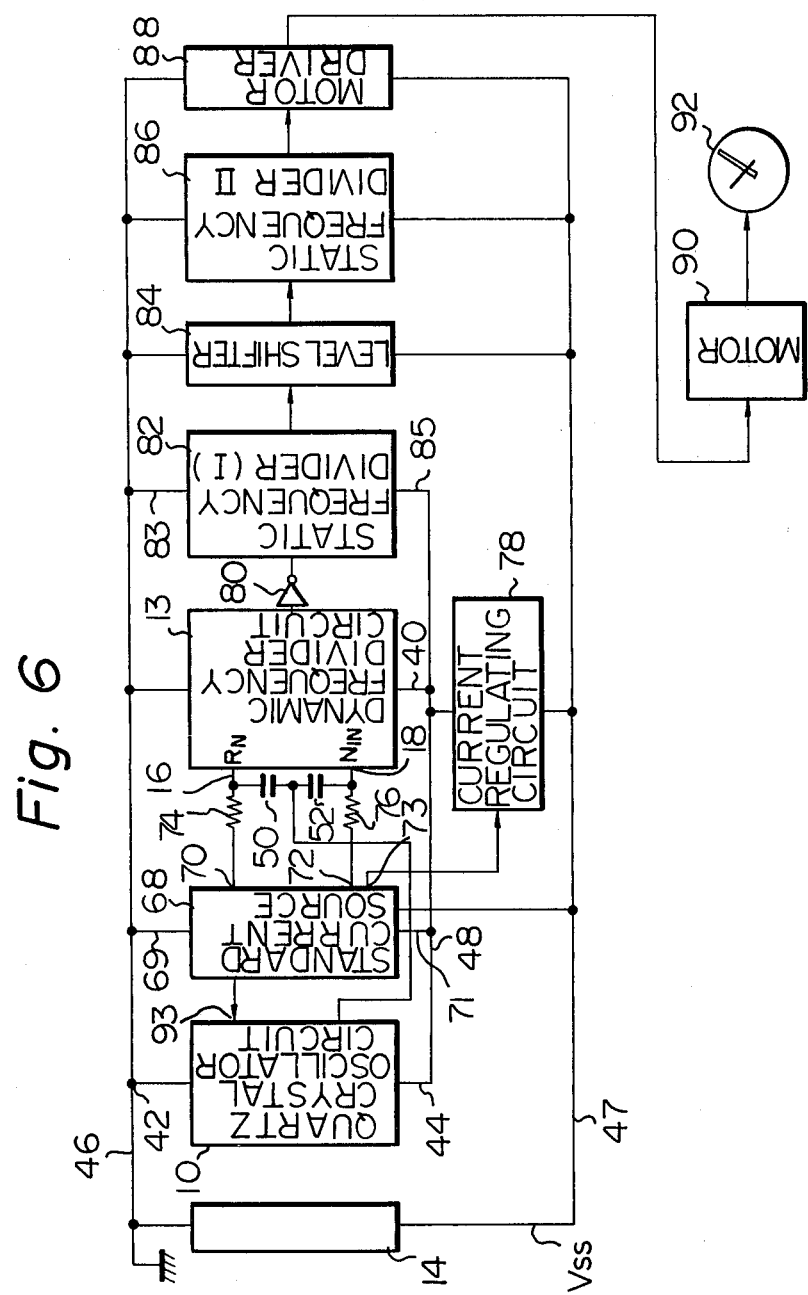
FIG. 6 is a block diagram of a third embodiment of the present invention, comprising an electronic timepiece having a standard current source for producing bias inputs applied by current mirror connection to a dynamic frequency divider circuit and a current regulating circuit for reducing the supply voltage applied to a standard frequency signal source, the standard current source and the dynamic frequency divider circuit.

Referring now to FIG. 6, an embodiment of an electronic timepiece according to the present invention is shown, in simplified block circuit diagram form. In this embodiment, a battery 14 supplies power over high potential and low potential supply lines 46 and 47 to a set of circuit blocks comprising a standard frequency signal source 10, a standard current source 68, a dynamic frequency divider circuit 13, and a static frequency divider circuit 82, through a current regulating circuit 78. Battery 14 also directly supplies a level shifter circuit 84, a second static frequency divider circuit 86, and a motor driver circuit 88. Drive signals produced by motor driver circuit 88, in response to a unit time signal from second static frequency divider circuit serve to periodically drive a stepping motor 90, which in turn drives an analog type of display 92 to provide an indication of current time information.

Current regulating circuit 78 is controlled by a signal from an output terminal 73 of standard current source 68 such that the current supplied by current regulating circuit 78 maintains a constant voltage between common voltage supply leads 46 and 48, with respect to variations in the voltage of battery 14. The standard current source 68 passes fixed currents through two field effect transistors, to thereby produce first and second bias voltages. These are applied by current mirror connection through resistors 74 and 76 respectively to input terminals 16 and 18 of dynamic frequency divider circuit 13, to thereby apply different bias voltages to a P-channel field-effect transistor group gate electrode and to an N-channel field-effect transistor group gate electrode respectively. A standard frequency signal produced by quartz crystal oscillator circuit 10 is applied through capacitors 50 and 52 to input terminals 16 and 18 respectively of dynamic frequency divider circuit 13. An output signal produced by frequency division of this standard frequency signal is applied from dynamic frequency divider circuit 13 to first static frequency divider circuit 82, through a buffer inverter 80. The output signal from first static frequency divider circuit 82 is transferred through a level shifter circuit 84 to the input of second static frequency divider circuit 86, since the supply voltages of first and second static frequency divider circuits 82 and 86 are different. Frequency division of the output signal from first static frequency divider circuit 82 by second static frequency divider circuit 86 produces a unit time signal, which is applied to motor driver 88.

The output signal from quartz crystal oscillator circuit 10 is input directly to dynamic frequency divider circuit 13, rather than through a buffer stage. Thus, the input capacitance of dynamic frequency divider circuit 13 forms a part of the overall tuned circuit capacitance of quartz crystal oscillator circuit 10, and an oscillation current component flows through this input capacitance. Capacitors 50 and 52 can conveniently be formed integrally within the integrated circuit containing dynamic frequency divider circuit 13, as gate electrode capacitances. In this case, connection from quartz crystal oscillator circuit 10 is made to the diffusion region side of such a gate capacitance, while connection to the input of dynamic frequency divider circuit 13 would be made to the gate electrode side of the capacitance.

In this embodiment, quartz crystal oscillator circuit 10 can operate at a high frequency of oscillation, for example of the order of 4 MHz.

The voltage provided across supply leads 46 and 48 is adjusted, by means of the control signal applied from terminal 73 of standard current source 68 to current regulating circuit 78, to the minimum level necessary for operation of quartz crystal oscillator circuit 10, standard current source 68, dynamic frequency divider circuit 13 and first static frequency divider circuit 82, so that the power consumption of these circuit blocks is held to a minimum. The output signal frequency from first static frequency divider circuit should preferably be of the order of 100 Hz. A bias current produced by standard current source 68 and applied to an input terminal 93 of quartz crystal oscillator circuit 10 serves to control the internal amplification factor of this oscillator circuit to a predetermined value.

Figure 7:
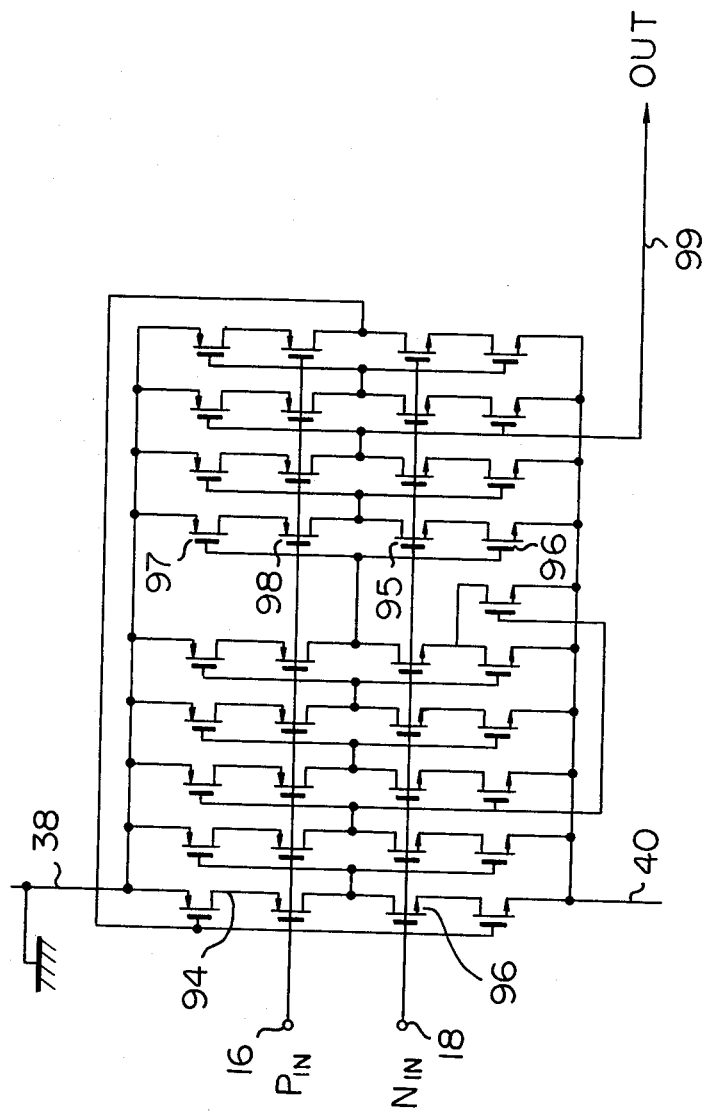
FIG. 7 is a circuit diagram of an example of a dynamic frequency divider circuit applicable to an electronic timepiece according to the present invention.

FIG. 7 shows an example of dynamic frequency divider circuit 13 in the embodiment of FIG. 6. This comprises a group of P-channel field-effect transistors (abbreviated hereinafter to P-channel FETs) denoted collectively by numeral 94, and a group of N-channel field-effect transistors (abbreviated hereinafter to N-channel FETs) denoted by numeral 96. As shown, a set of 9 transistors of the group of P-channel FETs (total 18 transistors) and a set of 9 transistors of the group of N-channel FETs (total 19 transistors) have their gate electrodes connected in common to input terminals 16 and 18 respectively. Thus, the current which flows through a series connected pair of transistors of the P-channel FET group, for example transistors 97 and 98, and hence flows through a corresponding series-connected pair of transistors of the N-channel FET group, i.e. as denoted by numerals 96 and 96, is determined by the bias voltages applied to the input terminals 16 and 18. These bias voltages are applied by current mirror connection arrangements to the standard current source 68, as described hereinafter, so that the current which flows through each stage of dynamic frequency divider circuit 13, e.g. that composed of P-channel FETs 97 and 98 and N-channel FETs 95 and 96, is held extremely stable, with respect to variations in the battery voltage of the timepiece.

The dynamic frequency divider circuit example of FIG. 7 has a frequency division ratio of ½, producing an output signal on line 99, and performs free-running oscillation in the absence of an input signal being coupled to terminals 16 and 18 from quartz crystal oscillator circuit 10. The frequency of this free-running oscillation is determined by the magnitudes of the bias voltages applied to terminals 16 and 18.

Figure 8:
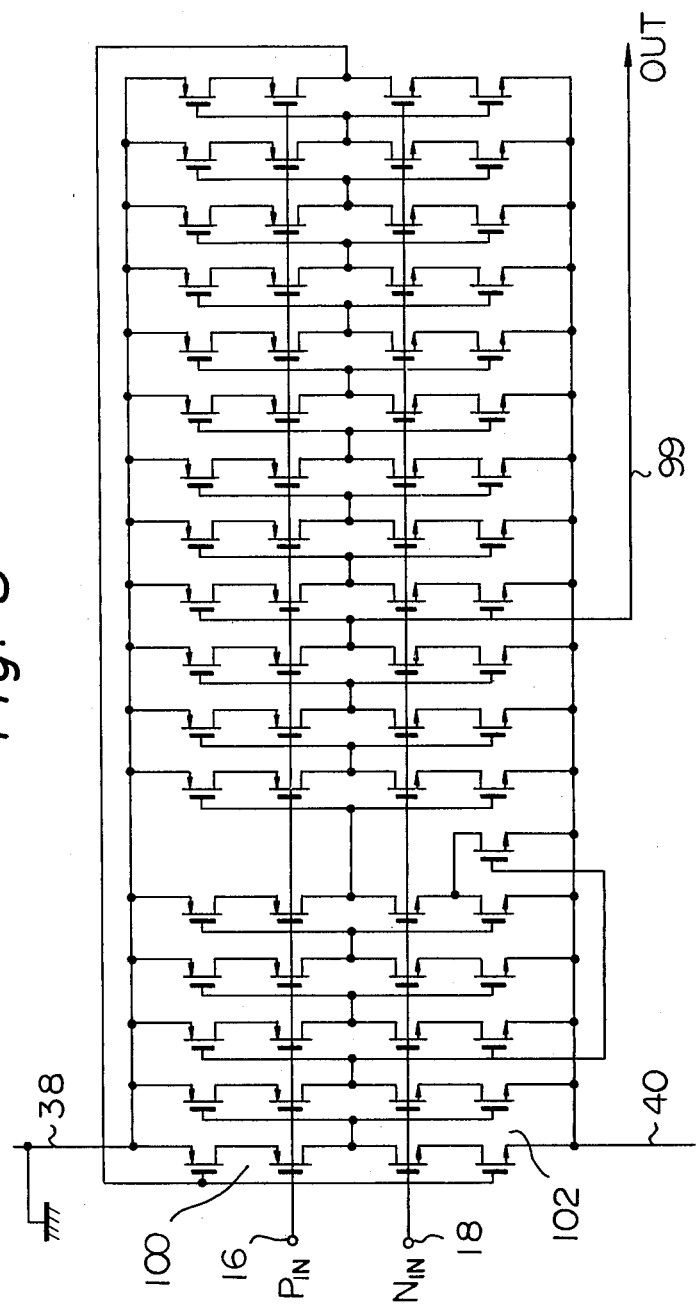
FIG. 8 is a circuit diagram of another example of a dynamic frequency divider circuit applicable to a timepiece according to the present invention.

FIG. 8 shows another example of dynamic frequency divider circuit 13 of FIG. 6. This circuit has a division ratio of 1/16, and comprises a group of 34 P-channel FETs denoted by numeral 100 and a group of N-channel FETs denoted by numeral 102.

Figure 9:
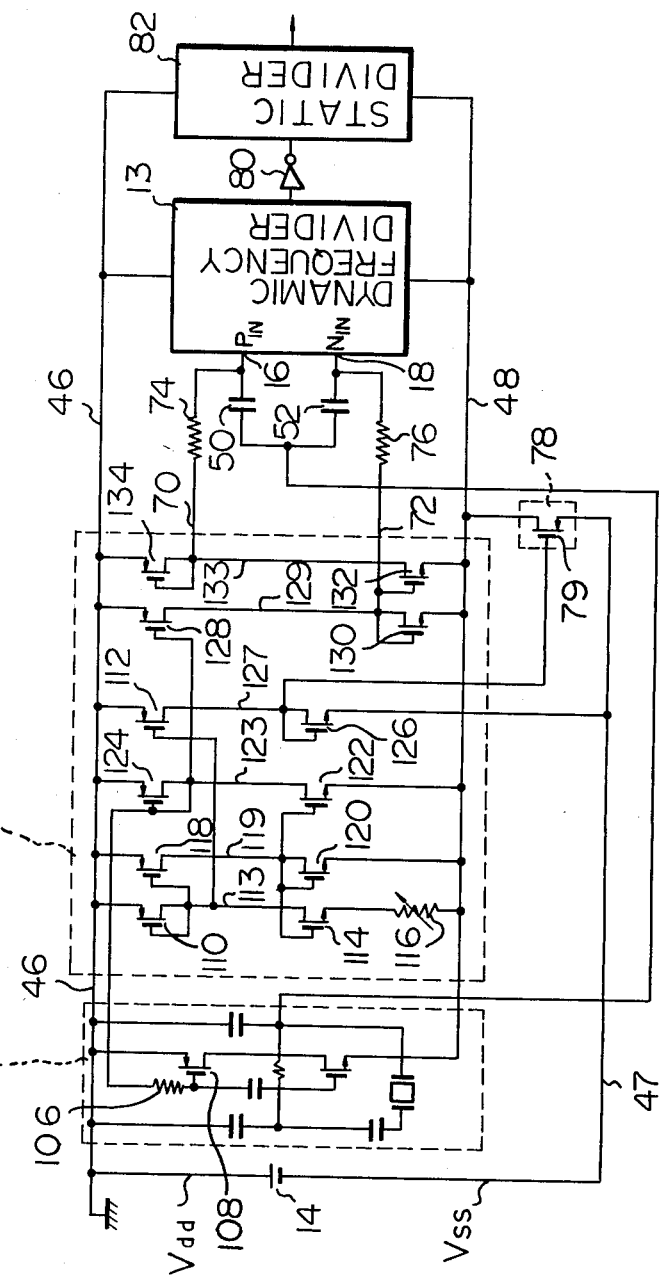
FIG. 9 is a circuit diagram of a quartz crystal oscillator circuit, standard current source and current regulating circuit, applicable to the timepiece embodiment of FIG. 6.

FIG. 9 is a circuit diagram showing specific circuit embodiments of quartz crystal oscillator circuit 10, standard current source 68 and current regulating circuit 78 of the embodiment of FIG. 6. Within standard current source 68, standard current control information is generated by a standard current setting circuit consisting of a feedback loop comprising P-channel FETs 110 and 118 and N-channel FETs 114 and 120, and variable resistor 116 used to adjust the value of the standard current. This circuit serves to established standard currents of fixed magnitude which flow in leads 113 and 119 respectively. A P-channel FET 112 is coupled in current mirror connection to lead 113 of the standard current setting section, and this transistor in conjunction with N-channel FET 126 forms a buffer circuit which produces a constant current flow in lead 127. Lead 127 is coupled to the gate of a transistor 79 which comprises current regulating circuit 78. Thus, the value of current flow in lead 127 is determined by the ratio of the value of W/L (channel width over channel length) of N-channel FET 112 to the value of W/L for N-channel FET 110. As a result, since the value of current flowing in lead 127 controls the current regulating circuit 78, the latter ratio of W/L values also determines the total current which flows in standard current source 68, quartz crystal oscillator circuit 10, dynamic frequency divider circuit 13, and static frequency divider circuit 82. This is becase transistor 79 is coupled by a current mirror connection to N-channel FET 126.

The P-channel FET 124 and N-channel FET 122 also form a buffer circuit controlling current flow in lead 123, and serve to supply current control information by current mirror connection to a circuit which provides the bias voltages input to dynamic frequency divider circuit 13. These bias voltages are produced by current mirror connection of a P-channel FET 134 through a resistor 74 to the input terminal 16 of dynamic frequency divider circuit 13, i.e. the gate and drain of transistor 134 are connected in common with the gate electrodes of a group of P-channel FETs in dynamic frequency divider circuit 13, as illustrated by the embodiments of FIG. 7 and FIG. 8. Similarly, an N-channel FET 130 provides a bias voltage for the N-channel FET group in dynamic frequency divider circuit 13 by being coupled in current mirror connection to terminal 18, i.e. the drain and gate of N-channel FET 130 are connected in common to gate electrodes of a group of N-channel FETs in dynamic frequency divider circuit 13. The current which flows in a lead 129 coupled to the drain and gate electrodes of N-channel FET 130 is controlled by a P-channel FET 128, coupled by current mirror connection to transistor 124. The current flowing in a lead 133, coupled to drain and gate electrodes of P-channel FET 134, is controlled by N-channel FET 132, which is coupled by current mirror connection to N-channel FET 130. Thus, the standard current information which controls the magnitude of current flow in lead 123 thereby controls the bias voltages, applied by current mirror connection to gate electrodes of the P-channel FET group and the N-channel FET group in dynamic frequency divider circuit 13. For a given value of current flow in lead 123, the current which flows in lead 129 is determined by the ratio of the W/L ratio of transistor 128 to the W/L ratio of transistor 124, due to the current mirror connection between these transistors. Similarly, if the current flow in lead 129 is fixed, then the current flow in lead 133 is determined by the ratio of the value of W/L for transistor 132 to the W/L value for transistor 130.

Resistors 74 and 76 are provided to prevent the output signal from quartz crystal oscillator circuit 10 from being by-passed by the low impedance of transistor 132 and transistor 134. Because of the high gate input impedance of field effect transistors, resistors 74 and 76 have no effect upon the current mirror connection to terminals 16 and 18. Thus, if the currents flowing in leads 129 and 133 are fixed, then the current which flows in each stage of dynamic frequency divider circuit 13, for example in the stage comprising transistors 95, 96, 97 and 98 in the embodiment of dynamic frequency divider circuit 13 shown in FIG. 7, will be determined by the ratio of the W/L value of transistor 134 to the W/L value for the P-channel FETs of dynamic frequency divider circuit 13 and by the ratio of the value of W/L for transistor 130 to the W/L value for the P-channel FETs of dynamic frequency divider circuit 13. It should be noted that although, strictly speaking, current flow in dynamic frequency divider circuit 13 is controlled by bias voltages applied to terminals 16 and 18 from standard current source 68, it is an essential feature of the present invention that these bias voltages are applied by a current mirror connection between transistors in standard current source 68 and transistors in dynamic frequency divider circuit 13. The term "bias voltage" is used for want of a more specific designation, within the present specification and in the appended claims, to refer to a voltage generated between drain and source terminals of a field-effect transistor forming part of a current mirror connection and applied to the gate electrode of one or more field effect transistors forming part of that current mirror connection.

As a result of the current mirror connection whereby dynamic frequency divider circuit 13 is controlled by standard current source 68, the D.C. current flow in each stage of dynamic frequency divider circuit 13 (e.g. that comprising transistors 95 to 98 in the example of FIG. 7) is held highly constant with respect to variations in the voltage of battery 14. The standard current source 68 also applies a current mirror bias input, through resistor 106, to the gate of FET 108 in quartz crystal oscillator circuit 10, to control the internal amplification of the oscillator circuit.

Figure 10:
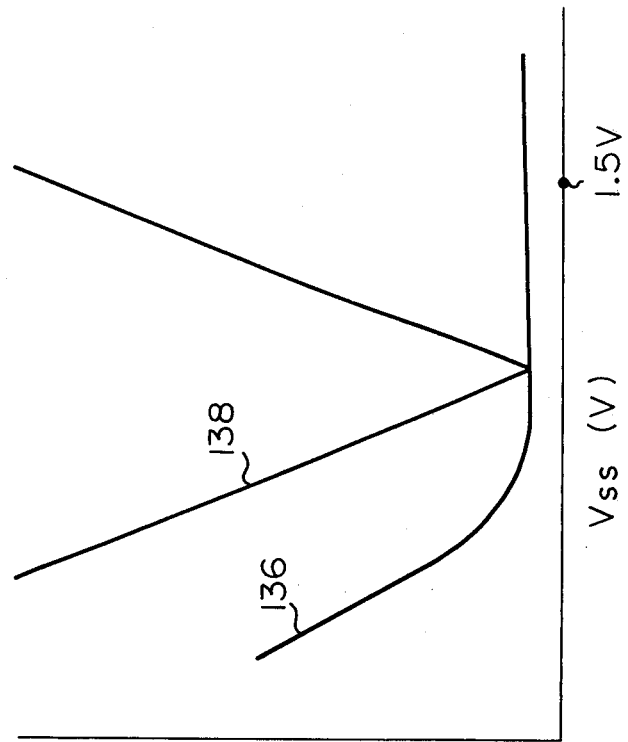
FIG. 10 is a graph illustrating the relationship between the minimum input signal voltage for correct frequency division operation relative to battery voltage, for a dynamic frequency divider circuit provided with bias inputs produced by current mirror connection to a standard current source and a supply voltage produced from a current regulating circuit, as shown in FIG. 9.

FIG. 10 illustrates the relationship between minimum input signal voltage amplitude for correct operation of dynamic frequency divider circuit 13 and the voltage Vss of battery 14, for a dynamic frequency divider circuited controlled by a standard current source according to the present invention, as indicated by characteristic 136. The corresponding characteristic for a dynamic frequency divider circuit of the prior art is indicated by numeral 138. As shown by characteristic 136, a dynamic frequency divider circuit according to the present invention has a very wide range of response to low level input signal amplitudes, with respect to supply voltage, i.e. correct operation of the dynamic frequency divider circuit is assured over a wide range of variation in the voltage of the timepiece battery, with a signal of very low amplitude being output by quartz crystal oscillator circuit 10. This improvement over the prior art, as represented by characteristic 138, is due to the current flow in the various stages of the dynamic frequency divider circuit being held constant to a high degree.

At very low levels of battery voltage, the minimum input signal voltage required begins to increase rapidly. This is due to the fact that at very low levels of supply voltage, some transistors within the dynamic frequency divider circuit cease to be turned fully into the ON state, so that performance begins to deteriorate.

It is a feature of current mirror circuit operation that, so long as the transistors comprising the current mirror circuit have identical threshold voltages, then correct operation of the circuit will be obtained in spite of variations in the absolute value of the threshold voltage. Such a condition can be readily met by forming all of the transistors of the current mirror circuit upon the same integrated circuit chip, as if all the transistors are of the same type, then they will have identical threshold voltages, although the magnitude of this voltage will vary due to processing irregularities. In addition, to assure proper operation of the current mirror circuit, it is necessary that the component transistors of the circuit all are maintained as closely as possible at the same operating temperature. This can be achieved by locating these transistors as closely together as possible upon the integrated circuit chip.

Resistors 74 and 76 should preferably be of very high resistance, of the order of 100 megohms. In order to eliminate any effects caused by leakage currents, therefore, these resistors should be formed of polysilicon resistors within the integrated circuit chip of the timepiece.

It should be noted that the embodiment of FIG. 9 provides enhanced timekeeping accuracy, in addition to the capability for operation over an extended range of battery voltage levels with a very low output signal level from quartz crystal oscillator circuit 10. This increased accuracy is due to the fact that, since the supply currents drawn by quartz crystal oscillator circuit 10 and by dynamic frequency divider circuit 13 are very closely regulated by current regulating circuit 78, the operating conditions of the transistors in these circuits are held highly constant in spite of variations in the voltage of battery 14. Thus, the output capacitance of quartz crystal oscillator circuit 10 is held stable with respect to battery voltage variations, and hence such variations will have a very reduced effect in altering the frequency of oscillation of quartz crystal oscillator circuit 10, by comparison with an electronic timepiece of the prior art.

As stated hereinabove, dynamic frequency divider circuit 13 will enter a state of free-running oscillation if the amplitude of the signal voltage from quartz crystal oscillator circuit 10 is reduced to zero. It is a feature of such a dynamic frequency divider circuit that optimum operating conditions with respect to low input signal level amplitudes are obtained when the frequency of this free-running oscillation is close to the correct output signal frequency from the dynamic frequency divider circuit while normal frequency division is being performed. This condition can be approximately met by suitable design, and thus the embodiment of FIG. 9 provides the advantage that, even if the quartz crystal oscillator circuit should cease to operate, for some reason, the timepiece will continue to operate, although at a much lower level of timekeeping accuracy.

Figure 11:
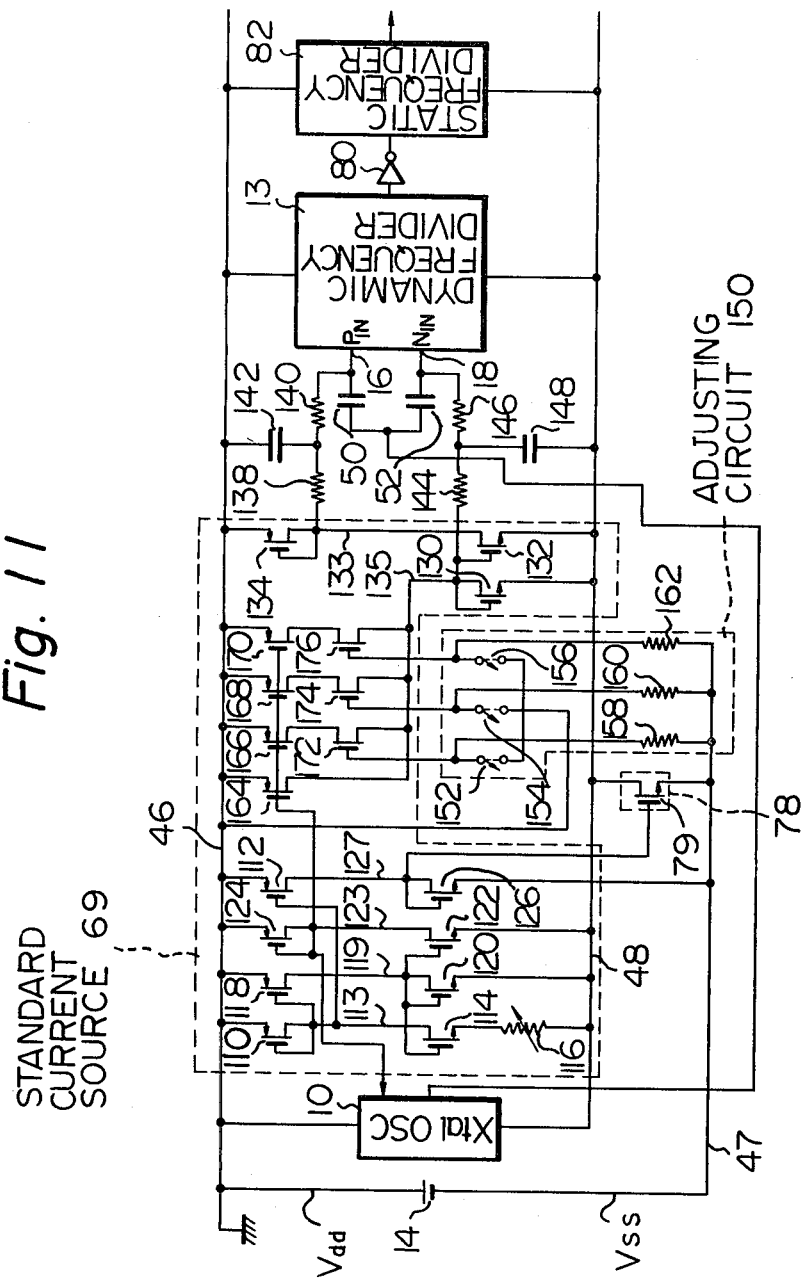
FIG. 11 is a circuit diagram of a standard current source for producing bias inputs applied by current mirror connection to a dynamic frequency divider circuit of an electronic timepiece according to the present invention, and further comprising adjusting circuit means for adjusting the magnitudes of the bias voltages.

FIG. 11 shows another embodiment of a standard current source according to the present invention. In this embodiment, standard current source 68 is basically similar to that of FIG. 9, but is provided with means for adjusting the bias inputs to dynamic frequency divider circuit 13. In the embodiment of FIG. 11, transistor 128 in the embodiment of FIG. 9 is replaced by a set of three transistors 164, 166, 168 and 170. A constant current flows through transistor 164. The current flow through transistors 166, 168 and 170 is either enabled or interrupted by means of a set of transistors 172, 174 and 176, respectively. The source electrodes of transistors 172, 174 and 176 are connected to the drain electrodes of transistors 166, 168 and 170 respectively, while the drain electrodes of transistors 172, 174 and 176 are connected in common with the drain electrode of transistor 164 to the drain and gate electrodes of transistor 130. The gate electrodes of transistors 172, 174 and 176 are connected through resistors 158, 160 and 162 respectively to the low potential output of battery 14, and are also selectively connectable, by switch terminals 152, 154 and 156 respectively, to the high potential output of battery 14. Since transistors 172, 174 and 176 are P-channel devices, it can be understood that when any of switch or terminal means 152, 154 or 156 is in the open condition, then since the gate electrode of the corresponding one of transistors 172 to 176 is thereby connected to the low potential side of battery 10, then that transistor will be in the ON, i.e. conducting state. Similarly, when one of switches 152 to 156 is closed, then the corresponding gate electrode of transistors 172 to 176 will be connected to the high potential of battery 14, so that the corresponding one of transistors 172 to 176 will enter the OFF, i.e. non-conducting state. Thus, by appropriately opening and closing switches 152 to 156, current flow from transistors 166, 168 and 170 can be selectively added to the current flow through transistor 164 on line 135. Adjusting circuit 150 can therefore be used to determine the current flow into transistor 130, and hence the level of bias input to dynamic frequency divider circuit 13.

The current which flows through any of trnsistors 166, 168 or 170 is determined by the ratio of the W/L value for that transistor to the value of W/L for transistor 130. Thus, the currents which flow through each of transistors 166 to 168 can be assigned a weighting factor, so that precise adjustment of the total current flow through lead 135 can be performed by switches 152 to 156 of adjusting circuit 150.

As stated above, with reference to the embodiment of FIG. 9, optimum operation of dynamic frequency divider circuit 13 with respect to low amplitude input signal levels from quartz crystal oscillator circuit 10 is obtained when the free-running frequency of oscillation of dynamic frequency divider circuit 13 (with the level of input signal from quartz crystal oscillator circuit 10 reduced to zero) is identical or close to the correct output signal frequency from dynamic frequency divider circuit 13 when normal frequency division operation is being carried out. Thus, for example, if the frequency of oscillation of quartz crystal oscillator circuit 10 is 4.19 MHz, and if the frequency division ratio of dynamic frequency divider circuit 13 is 1/16, then the bias applied to dynamic frequency divider circuit 13 by current mirror coupling from transistors 134 and 130 to terminals 16 and 18 should be adjusted such that, with the output signal from quartz crystal oscillator circuit 10 set to zero, the free-running frequency of oscillation of dynamic frequency divider circuit 13 is close to a value of 262 KHz. Adjustment of this free-running frequency of oscillation to this optimum value can be performed, in the embodiment of FIG. 11, by appropriately setting switches 152 to 156 of adjusting circuit 150 such that the standard current flowing in lead 133 causes the bias inputs to dynamic frequency divider circuit 13 from transistors 130 and 134 to produce this desired free-running frequency of oscillation.

It should be noted that switches 152 to 156 of adjusting circuit 150 can be of various types, including mechanical switches, conductors which can be selectively open-circuited, terminals which can be selectively short-circuited, elements of a write-only memory, etc.

In order to ensure proper operation of the embodiment of FIG. 11, it is necessary to ensure that the effects of leakage currents flowing in transistors 172, 174 and 176 is negligible with respect to the approximate level of standard current flow in lead 135, which would typically be of the order of 10 nanoamperes. This can be ensured by making the threshold voltage of transistors 172 to 176 higher than the threshold voltage of the other transistors of the standard current source 68. Such selective differences in the threshold voltages can be achieved during manufacture of the integrated circuit of the timepiece, by selective channel doping.

The circuits composed of resistors 138 and 140 with capacitor 142, and also resistors 144 and 146 with capacitor 148, serve to reduce the effects of transient variations in the voltage of battery 14 upon the bias inputs applied to terminals 16 and 18 of dynamic frequency divider circuit 13. At low operating temperatures, the internal resistance of a timepiece battery rises to a higher than normal value. Thus, if the timepiece includes a stepping motor to drive an analog type of time display, then each time a drive pulse is applied to the stepping motor under low temperature operating conditions, the voltage output from the battery will fall, temporarily. The circuits composed of resistors 138 and 140 with capacitor 142, and resistors 144 and 146 with capacitor 148 serve to substantially filter out such transient fluctuations in the voltage of battery 14 so that constant bias inputs are applied to terminals 16 and 18, thereby improving the reliability of operation of dynamic frequency divider circuit 13.

As described hereinabove, it is desirable that the threshold voltages of the transistors in a current mirror circuit should all be identical, to ensure satisfactory operation of the circuit. In the embodiment of FIG. 6 above, it is desirable to keep the current flowing in leads 129 and 123, which determine the bias inputs applied to dynamic frequency divider circuit 13, as low as possible. This can be done by making the channel length L of transistors 130 and 134 of standard current source 68 longer than the value of L for the transistors in dynamic frequency divider circuit 13, for example several tens of times the value of L for the latter transistors. If this is done, then a very small standard current flowing in leads 129 and 133 can control a substantially larger current flow in each stage of dynamic frequency divider circuit 13. However, such a measure will result in the threshold voltage of transistors 130 and 134 being different from the threshold voltage of the transistors in dynamic frequency divider circuit 13.

Figure 12:
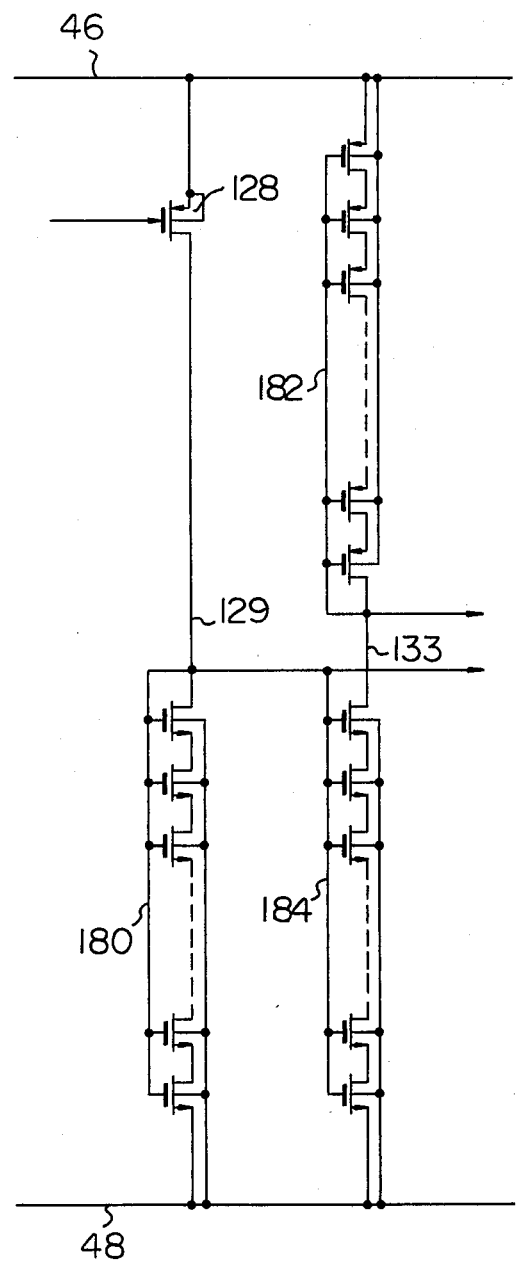
FIGS. 12, 13, 14, 15, 16 and 17 show various examples of different configurations of part of a standard current source for an electronic timepiece according to the present invention, whereby transistors of identical or similar type may be used both in the standard current source and in the dynamic frequency divider circuit.

FIG. 12 shows an example of a circuit configuration to overcome the problems described above. Here, groups of series-connected transistors denoted by numerals 180, 182 and 184 replace transistors 130, 134 and 132 respectively in the embodiment of FIG. 6. The transistors which make up these transistor groups 180 to 184 can be identical to the transistors used in dynamic frequency divider circuit 13, or can have closely similar values of W/L ratio. In this case, if transistor group 182 comprises n transistors, then the current flowing in each stage of dynamic frequency divider circuit 13 P-channel transistor group will be equal to n times the value of current flowing in lead 133, while proper current mirror operation will be ensured. The arrangement of FIG. 12 has the disadvantage, however, that it is possible for some of the gate electrodes of the transistors in these transistor groups to become reverse-biased. This can result in incorrect operation of the current mirror circuits.

Figure 13:
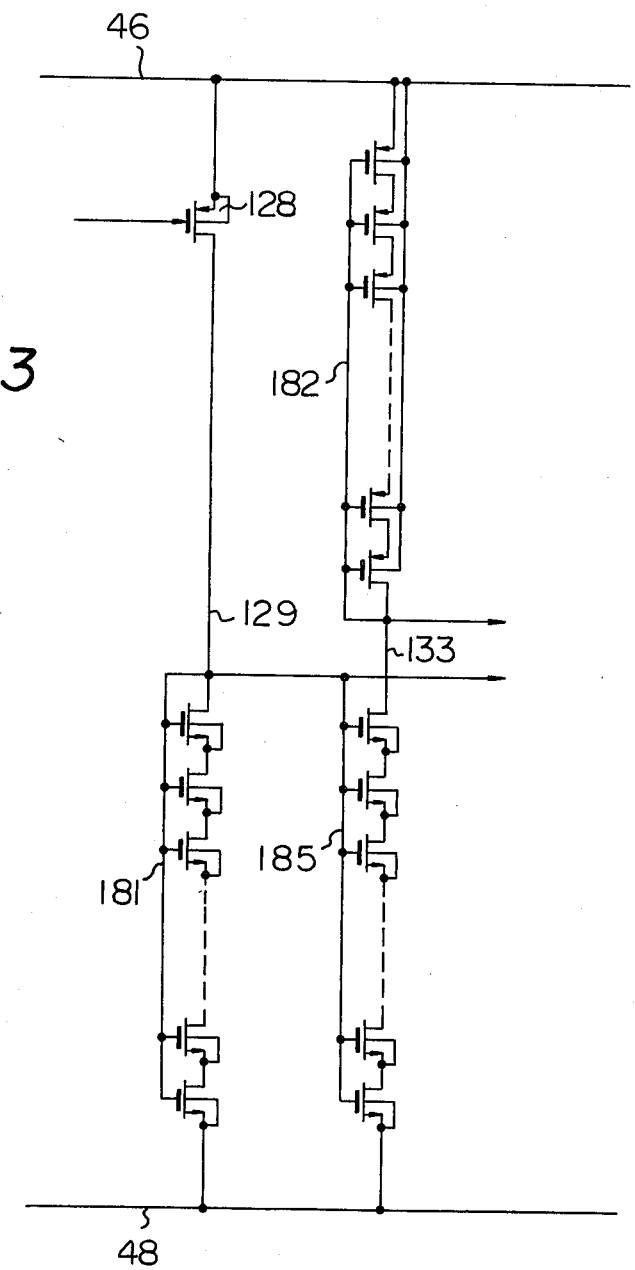
Figure 14:
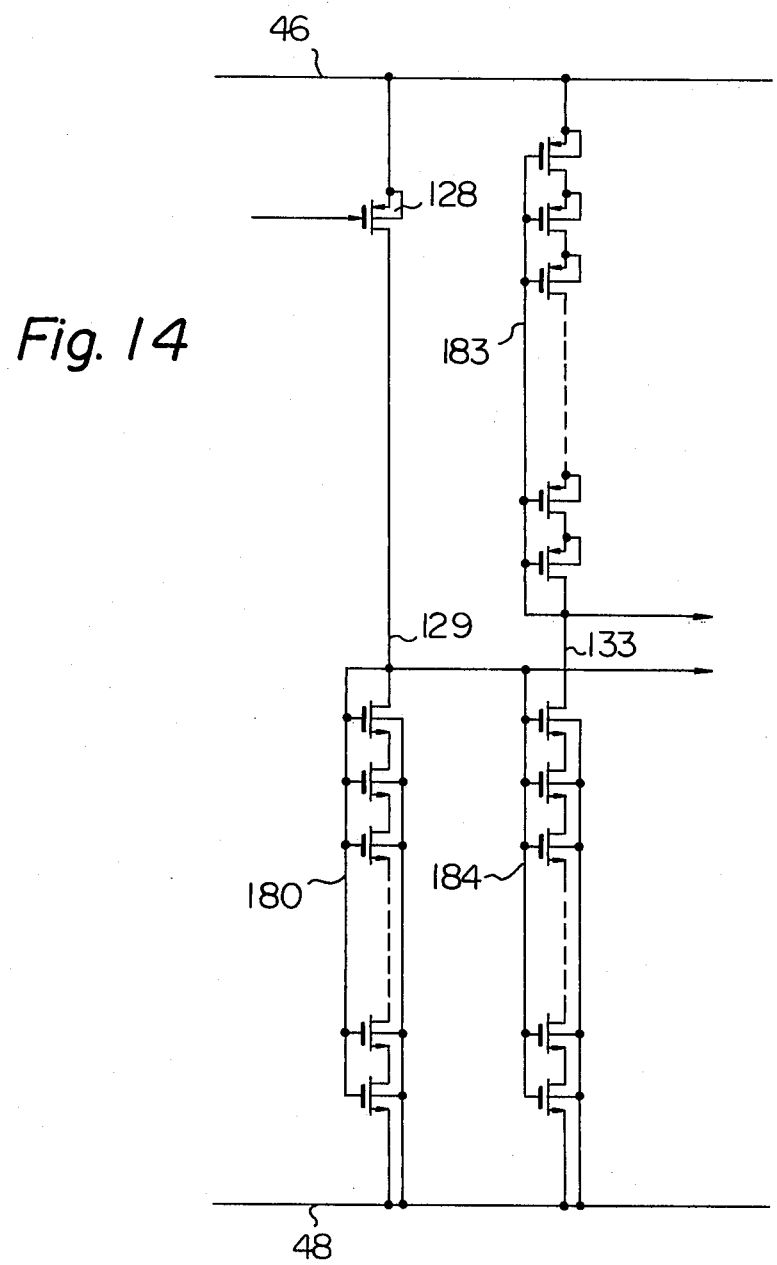

FIG. 13 shows another example of a circuit for providing current mirror coupling to dynamic frequency divider circuit 13. In this case, transistors 130, 134 and 132 are replaced by transistor groups 181, 182 and 185, and the substrates of the transistors in the N-channel FET groups 181 and 185 are isolated. This will eliminate the reverse gate bias effect referred to above, and can be used when the integrated circuit employs an N-type semiconductor substrate.

FIG. 4 shows another example of such a circuit, in which transistors 130, 134 and 132 of the embodiment in FIG. 6 are replaced by transistor groups 180, 183 and 184. In this case, the substrates of the transistors of P-channel FET group 183 are isolated, to thereby eliminate the reverse gate bias effect. This method can be used when a P-type semiconductor substrate is used for the integrated circuit.

Figure 15:
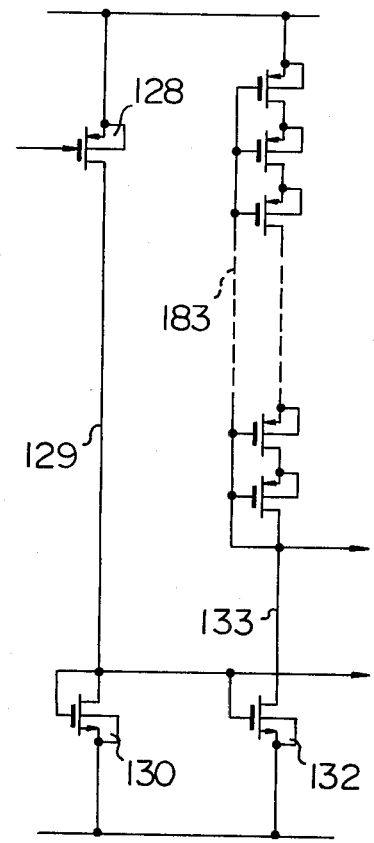
Figure 16:
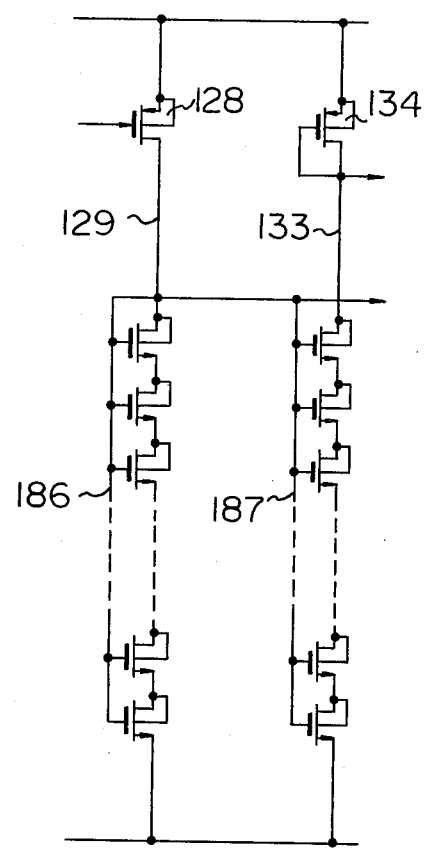
Figure 17:
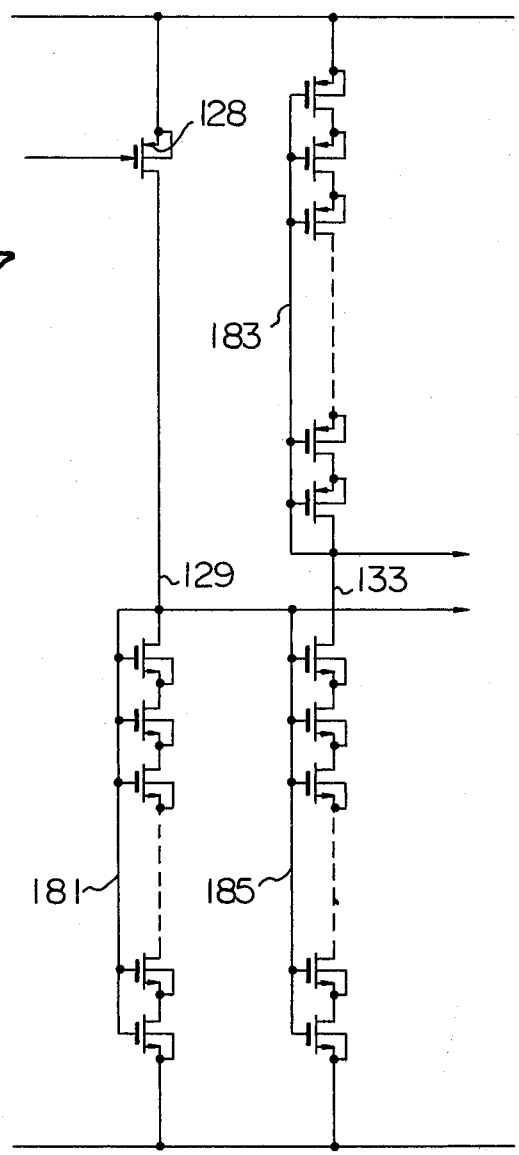

If the reverse gate bias effect is extremely troublesome, then the circuit arrangements shown in FIG. 16 or FIG. 17 can be employed, in which the substrates of both P-channel FETs and N-channel FETs are isolated. In these embodiments, only those transistors of transistors 130, 132 and 134 in the embodiment of FIG. 6 whose substrates can be isolated are replaced by groups of transistors. The arrangement of FIG. 15 is applicable when a P-type substrate is used in the timepiece IC, while that of FIG. 16 can be used when an N-type substrate is employed.

FIG. 17 shows another arrangement to eliminate the reverse gate bias effect, which is applicable when the substrates of both P-channel FET groups and N-channel FET groups can be isolated. Here, transistors 130, 132 and 134 in the embodiment of FIG. 5 are replaced by transistor groups 181, 183 and 185, respectively.

It should be noted that, although the present invention has been described with reference to an electronic timepiece having a dynamic frequency divider circuit as a primary frequency divider, it is also applicable to a timepiece in which a static frequency divider circuit is used as the primary frequency divider, coupled to the output from a quartz crystal oscillator circuit, where the static frequency divider circuit comprises a group of P-channel FETs and a group of N-channel FETs which can be controlled by a current mirror bias input from a standard current source.

It should also be noted that although the described embodiments refer to a timepiece employing a stepping motor, the present invention is not restricted in application to such a timepiece, but is equally applicable to a digital display type of timepiece.

It should also be noted that, although means for adjusting the standard current level of a standard current source is shown in the described embodiments, i.e. variable resistor 116, such means may be omitted, depending upon the degree of accuracy required, and the level of manufacturing consistency attainable. Similarly, the adjusting circuit means in the embodiment of FIG. 11 may be omitted, or may be set to an identical adjustment condition for a large number of timepieces, once a suitable adjustment condition has been ascertained, rather than being individually adjusted for each timepiece.

From the preceding description, it will be apparent that the objectives set forth for the present invention are effectively attained. Since various changes and modifications to the above construction may be made without departing from the spirit and scope of the present invention, it is intended that all matter contained in the above description or shown in the accompanying drawings shall be interpreted as illustrative, and not in a limiting sense. The appended claims are intended to cover all of the generic and specific features of the present invention.

I claim:

1. An electronic timepiece powered by a battery, comprising:

a standard frequency signal source for producing a standard frequency signal, said standard frequency signal source being provided with a high potential power supply lead and a low potential power supply lead;

first frequency divider circuit means for performing frequency division of said standard frequency signal source to produce an output signal, said first frequency divider circuit means being provided with a high potential power supply lead and a low potential power supply lead and comprising a group of P-channel field-effect transistors each having a gate electrode thereof coupled to receive said strandard frequency signal and a group of N-channel field-effect transistors each having a gate electrode thereof coupled to receive said standard frequency signal, said N-channel field-effect transistor group gate electrodes being electrically isolated from said P-channel field-effect transistor group gate electrodes with respect to direct current flow;

second frequency divider circuit means for performing frequency division of said output signal from said first frequency divider circuit means to thereby produce a unit time signal;

drive circuit means coupled to receive said unit time signal for thereby producing a drive signal;

time display means responsive to said drive signal for indicating time information; and bias circuit means comprising a standard current source for producing first and second bias voltages, said bias circuit means being provided with a high potential power supply lead which is connected in common with said high potential power supply lead of the first frequency divider circuit means, and a low potential power supply lead which is connected in common with said low potential power supply lead of the first frequency divider circuit means, said first bias voltage being applied to the gate electrodes of said P-channel field-effect transistor group to control an operating condition thereof and said second bias voltage being applied to the gate electrodes of said N-channel field-effect transistor group to control an operating condition thereof, said standard current source comprising at least one P-channel field-effect transistor and at least one N-channel field-effect transistor connected in series between said high potential power supply lead and low potential power supply lead of said first frequency divider circuit means.

2. An electronic timepiece according to claim 1, in which said standard current source is coupled to the gate electrodes of said P-channel field-effect transistor group and to the gate electrodes of said N-channel field-effect transistor group by current mirror circuits.

3. An electronic timepiece according to claim 1, in which said first frequency divider circuit means comprise a dynamic frequency divider circuit.

4. An electronic timepiece according to claim 1, and further comprising current regulating circuit means operating from a current produced by said standard current source as a current reference, and wherein said high potential power supply leads of said standard frequency signal source and said first frequency divider circuit means are connected in common while said low potential power supply leads of said standard frequency signal source and said first frequency divider circuit means are connected in common, and wherein of the junction of said high potential power supply leads and the junction of said low potential power supply leads, one junction is connected directly to a first potential of said battery and the other junction is connected through said current regulating circuit means to the opposite potential of said battery.

5. An electronic timepiece according to claim 1, in which said standard current source is further coupled by current mirror connection to apply a bias voltage to said standard frequency signal source.

* * * * *